(12) United States Patent
Zhou et al.

(10) Patent No.: US 11,393,706 B2
(45) Date of Patent: Jul. 19, 2022

(54) MAGNETICALLY-LEVITATED TRANSPORTER

(71) Applicant: Massachusetts Institute of Technology, Cambridge, MA (US)

(72) Inventors: Lei Zhou, Cambridge, MA (US); David L. Trumper, Plaistow, NH (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 17/047,879

(22) PCT Filed: Apr. 19, 2019

(86) PCT No.: PCT/US2019/028266
§ 371 (c)(1),
(2) Date: Oct. 15, 2020

(87) PCT Pub. No.: WO2019/204692
PCT Pub. Date: Oct. 24, 2019

(65) Prior Publication Data
US 2021/0159091 A1 May 27, 2021

Related U.S. Application Data

(60) Provisional application No. 62/660,417, filed on Apr. 20, 2018.

(51) Int. Cl.
*G03F 7/20* (2006.01)
*H01L 21/677* (2006.01)
(Continued)

(52) U.S. Cl.
CPC ............ *H01L 21/677* (2013.01); *B60L 13/06* (2013.01); *G03F 7/70758* (2013.01); *H02N 15/00* (2013.01)

(58) Field of Classification Search
CPC ........ H01L 21/677; B60L 13/06; B60L 13/10; G03F 7/70758; H02N 15/00; H02K 11/215; H02K 41/03
See application file for complete search history.

(56) References Cited

U.S. PATENT DOCUMENTS

| 4,577,959 A | 3/1986 | Yazaki |
| 7,868,488 B2 | 1/2011 | Lee |

(Continued)

FOREIGN PATENT DOCUMENTS

WO    WO 2018/213825    11/2018

OTHER PUBLICATIONS

International Preliminary Report on Patentability dated Oct. 29, 2020 for International Application No. PCT/US2019/028266; 7 Pages.

(Continued)

*Primary Examiner* — Mesfin T Asfaw
(74) *Attorney, Agent, or Firm* — Daly, Crowley, Mofford & Durkee LLP

(57) ABSTRACT

Described herein is a magnetically levitated linear transportation stage which utilizes a permanent magnet bias flux to generate a passive magnetic/suspension force/torque in a first set of directions orthogonal to a direction of transportation stage travel, a motor flux which forms a traveling wave along a direction of transportation stage travel and a suspension control force orthogonal to the direction of transportation stage travel. Such a magnetically levitated linear transportation stage is suitable for use in in-vacuum transportation tasks such as in conjunction with photo lithography systems (e.g. extreme ultra violet (EUV) machines).

27 Claims, 11 Drawing Sheets

(51) Int. Cl.
  *B60L 13/06*      (2006.01)
  *H02N 15/00*      (2006.01)

(56) References Cited

U.S. PATENT DOCUMENTS

| | | |
|---|---|---|
| 2001/0019250 A1 | 9/2001 | Lee |
| 2003/0068215 A1 | 4/2003 | Mori et al. |
| 2004/0160132 A1 | 8/2004 | Carter et al. |
| 2005/0133732 A1 | 6/2005 | Ohtomo et al. |
| 2005/0168076 A1 | 8/2005 | Hazelton |
| 2005/0174551 A1 | 8/2005 | Phillips |
| 2006/0033903 A1 | 2/2006 | Yuan et al. |
| 2008/0054838 A1 | 3/2008 | Butler et al. |
| 2008/0129977 A1 | 6/2008 | Nishimura |
| 2012/0099095 A1 | 4/2012 | Zhu et al. |
| 2013/0099095 A1 | 4/2013 | Parks |
| 2013/0249324 A1* | 9/2013 | Gandhi ............... H02K 41/033 310/12.18 |
| 2014/0111780 A1* | 4/2014 | Iwase ............... G03F 7/70841 355/27 |
| 2015/0175031 A1 | 6/2015 | Henderson et al. |
| 2016/0065043 A1 | 3/2016 | Lu et al. |
| 2017/0115580 A1* | 4/2017 | Zhu ............... G03F 7/70758 |
| 2019/0179233 A1* | 6/2019 | Butler ............... G03F 7/70775 |

OTHER PUBLICATIONS

U.S. Appl. No. 16/490,206, filed Aug. 30, 2019, Trumper, et al.
Holmes et al. "The long-range scanning stage: a novel platform for scanned -probe microscopy" Precision Engineering Journal of the International Societies for Precision Engineering and Nanotechnology, Jun. 22, 1999, 19 pages.
Jung et al. "Study on a Novel Contact-Free Planar System Using Direct Drive DC Coils and Permanent Magnets", IEEE/ASME Transactions on Mechatronics, vol. 7, No. 2, Mar. 2002, 9 pages.
Kim et al. "High-Precision Control of a Maglev Linear Actuator with Nanopositioning Capability", Proceedings of the American Control Conference Anchorage, AK May 8-10, 2002, 6 pages.
Kim et al. "High-precision magnetic levitation stage for photolithography" Precision Engineering 22:66-77, Jan. 1998, 12 pages.
Mori et al. "Linear Actuator with Air Bearing for Highly Precise Tracking" IEEE, Jan. 2002, 2 pages.
Verma et al. "Multi-Axis Maglev Nanopositioner for Precision Manufacturing and Manipulation Applications", IEEE Jan. 2004, 8 pages.
Woo et al. "Design and Optimization of Long Stroke Planar Motion Maglev Stage using Copper Strip Array" International Journal of Precision Engineering and Manufacturing vol. 16, No. 3, pp. 479-485, 7 pages.
PCT International Search Report and Written Opinion dated Aug. 24, 2018 for International Application No. PCT/US2018/033662; 17 Pages.
International Preliminary Report on Patentability dated Nov. 28, 2019 for PCT Application No. PCT/US2018/033662; 10 pages.
Search Report of the ISA dated Jul. 12, 2019 for International Application No. PCT/US2019/028266; 3 Pages.
Written Opinion of the ISA dated Jul. 12, 2019 for International Application No. PCT/US2019/028266; 9 Pages.
Zhou, et al.; "Position Control for Hysteresis Motors: Transient-time and Field-oriented Control"; IEEE International Electric Machines and Drives Conference (IEMDC); May 2017; 10 Pages.
Restriction Requirement dated Nov. 17, 2021 for U.S. Appl. No. 16/490,206; 7 Pages.
Response to Restriction Requirement dated Nov. 17, 2021 for U.S. Appl. No. 16/490,206; Response filed Dec. 21, 2021; 1 Page.
PCT International Preliminary Report of Patentability dated Nov. 28, 2019 for International Application No. PCT/US2018/033662; 10 Pages.

\* cited by examiner

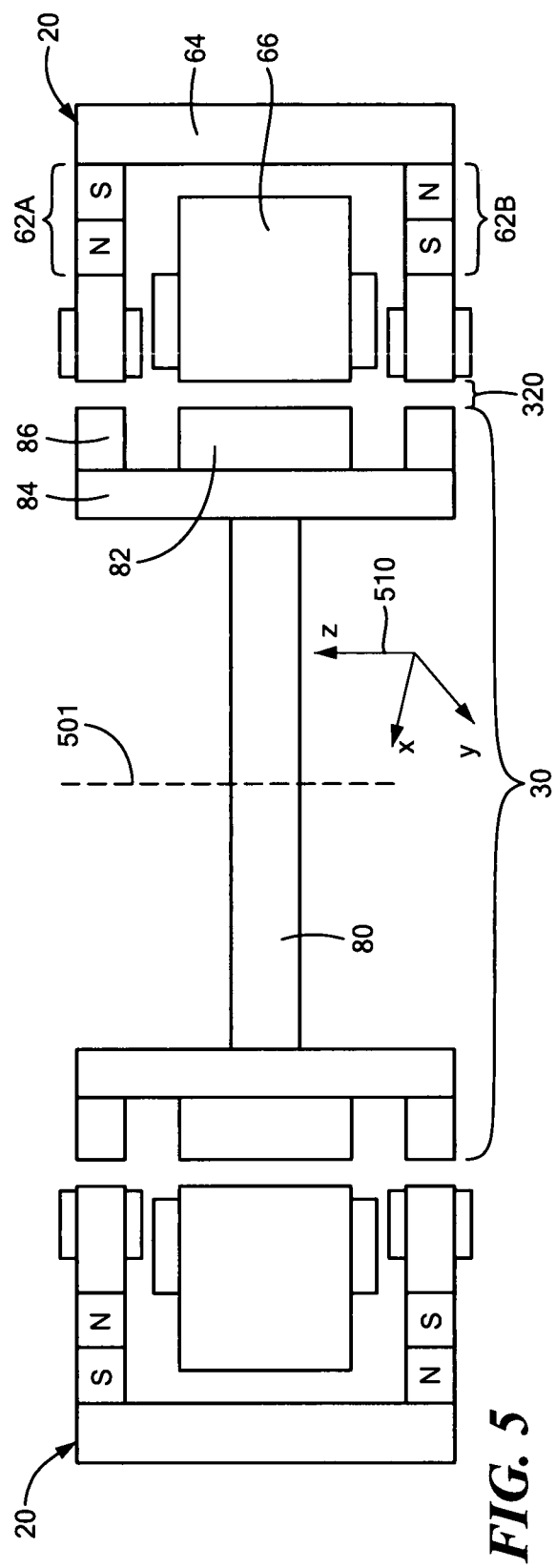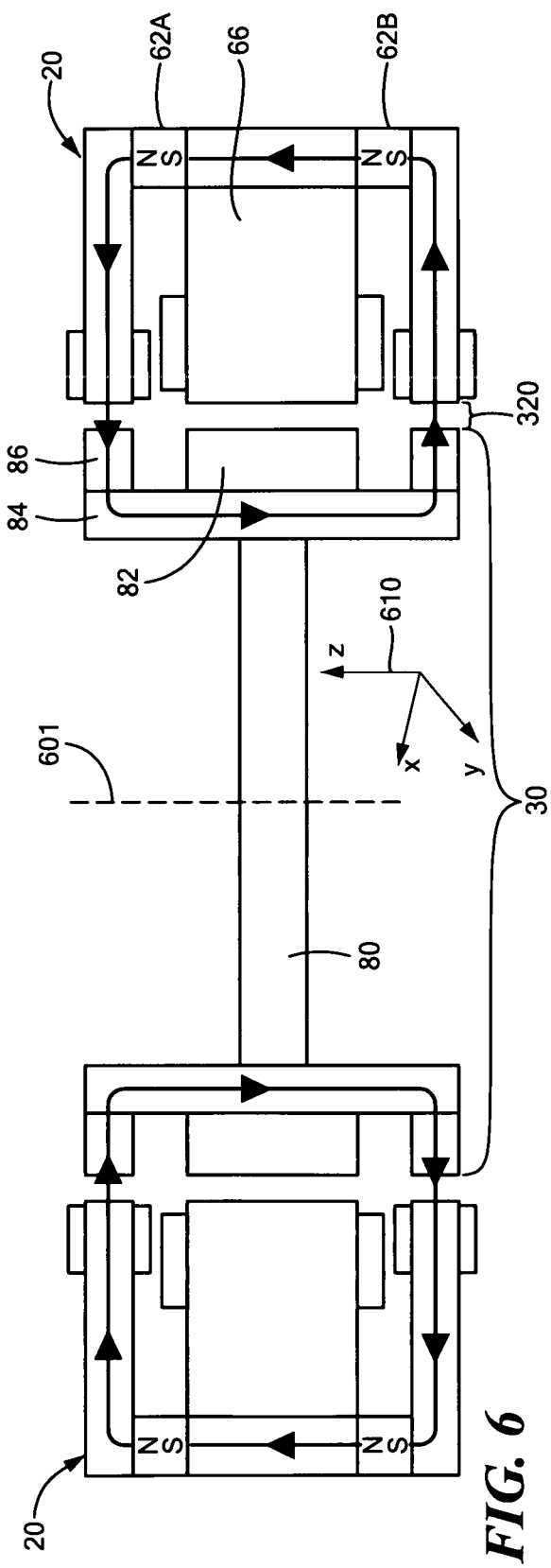
FIG. 5
FIG. 6

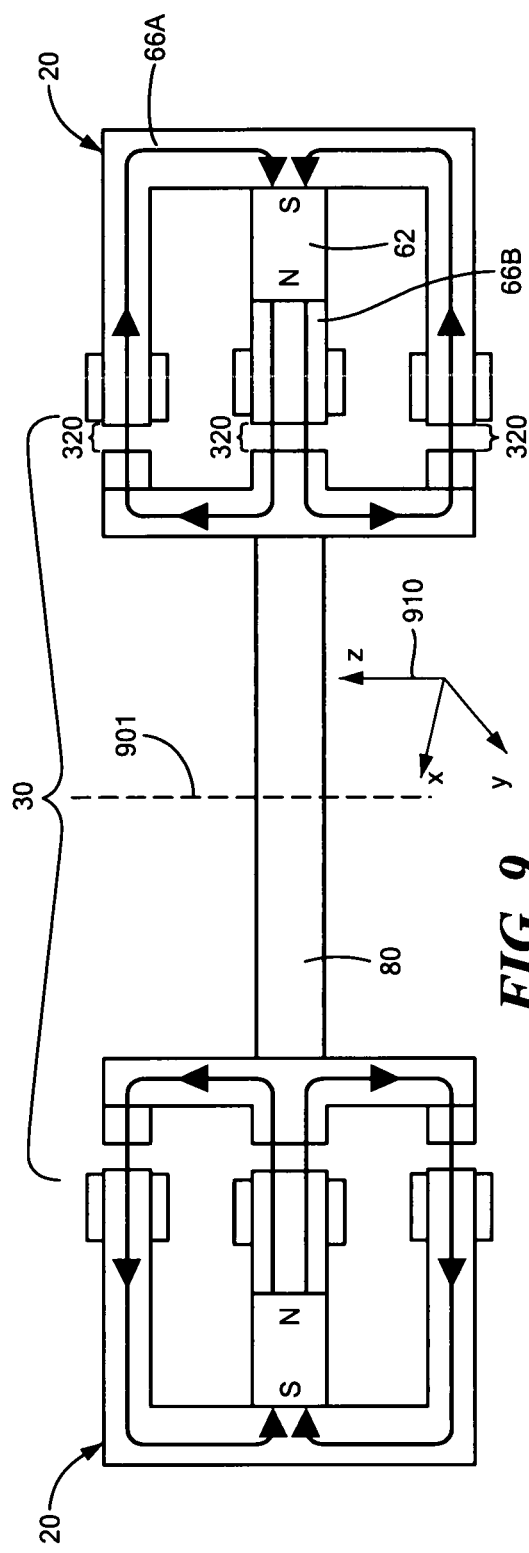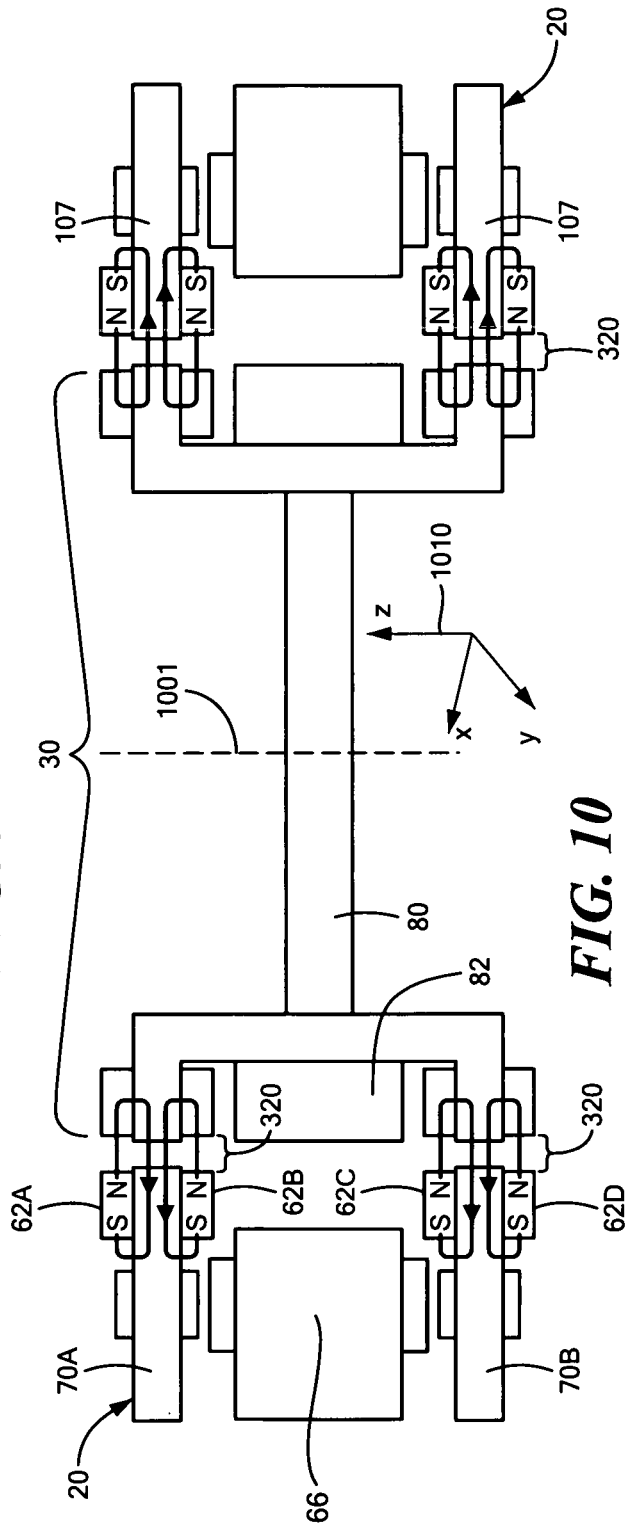

MAGNETICALLY-LEVITATED TRANSPORTER

CROSS REFERENCE TO RELATED APPLICATIONS

This application is a U.S. National Stage of International Application PCT/US2019/028266 filed in the English language on Apr. 19, 2019 and entitled "MAGNETICALLY-LEVITATED TRANSPORTER," which claims the benefit of Provisional Application 62/660,417 filed Apr. 20, 2018 the contents of which are hereby incorporated by reference as if fully set forth herein.

BACKGROUND OF THE DISCLOSURE

As is known in the art, handling or transporting a photomask or reticle through or within a photo lithography machine has become increasingly challenging since the introduction of extreme ultraviolet (EUV) lithography tools. Previous versions of ultraviolet-based lithography machines permitted in-air transmission of UV light at wavelengths of around 193 nm. EUV tools or machines require transmission of light within a vacuum and are now being used to manufacture devices having nanoscale and sub-nanoscale sized features. Within these EUV machines, a light source having a wavelength of approximately 13.5 nm can be applied to a patterned surface called a photomask or reticle causing the patterned surface to be imparted onto a substrate coated with a photosensitive chemical. The 13.5 nm wavelength of light used within the EUV systems permit the manufacturing of a single device or integrated circuit in less time than previous generation lithography systems by reducing the number of times a substrate wafer must pass through a lithography machine to create a device or integrated circuit (IC) with nanoscale sized features.

When using an extreme-UV lithography machine, the environment within the machine should in most embodiments comprise a vacuum and be controlled to minimize vibrations and contaminants. The vacuum chamber within the EUV environment can be a high-vacuum or ultra-high-vacuum chamber that permits the 13.5 nm light to travel. Pressure within this chamber can be within a range of $10^{-3}$ to $10^{-8}$ torr for high-vacuum chambers, or less than $10^{-8}$ torr for ultra-high-vacuum chambers. Vibrations transmitted to any aspect of the lithography machine, the environment within the lithography machine, or reticles, photomasks or substrates within the lithography machine, can negatively impact the quality and accuracy of IC features created using the lithography machine. Similarly, the presence of contaminants within the lithography machine environment can also impact the machine's ability to accurately and correctly impart a photomask image onto a substrate.

Manufacturing of a device or IC with a lithography machine often requires passing a wafer or substrate through the lithography machine or tool more than once. In some instances, the process can also include transporting the photomask or reticle between one or more positions, such as a storage position and a scanning position. Passage of the reticle from one position to another can also require passing the reticle through a low-pressure area or space comprising nitrogen. Any transport mechanism used to move a reticle within the lithography machine must comply with all ultra-tight contamination requirements and therefore must operate without creating a substantial amount of vibration or generating a substantial amount of contaminants within the lithography machine environment. It is therefore necessary to provide a method, system or assembly for moving or transporting a reticle through a lithography machine while maintaining ultra-tight contamination requirements and without creating a significant amount of additional vibration.

In addition to satisfying ultra-tight contamination and vibration requirements, any reticle transporters or transport mechanisms must have dimensions that are smaller than a constrained area within the lithography machine. The EUV lithography tools are increasingly complex and therefore have a constrained area within which to house a reticle transporter. Typical robotic manipulator systems are too large to fit within the constrained spaces present in UV and extreme UV photo lithography systems. Therefore, what is needed is a reticle transporter or transport mechanism that does not use the large motors and gears typically found in robotic manipulator systems, but that can move a reticle through a constrained area within a complex lithography machine.

SUMMARY

Described herein is a magnetically levitated linear stage ("MLLS") that can be used within a complex lithography machine to transport a reticle from one position to another within the lithography machine. Unlike typical robotic manipulator systems, the MLLS described herein can fit within the constrained vertical area or height of typical complex lithography machines such as EUV lithography tools. The MLLS uses magnetic levitation to move a stage carrying a reticle thereby eliminating the need for mechanical bearings which often generate particles during operation as well as mechanical friction which causes power dissipation. Linear motors such as hysteresis motors ("HMs") can be used to move the stage. Such motors provide advantages such as a simple architecture, relatively-low, vibration-free operation, high rotor thermal and mechanical robustness, and allow low secondary loss.

In some embodiments, a magnetically levitated stage assembly can comprise a first motor stator that includes the first portion of a first hysteresis motor, and a second motor stator comprising a first portion of a second hysteresis motor. The second motor stator is positioned opposite of the first motor stator to create a transportation channel between the first and second motor stator. A stage that can move within the transportation channel and along a first axis can be included in the assembly. The first portion of the first hysteresis motor and the first portion of the second hysteresis motor are magnetically coupled to the stage to drive the stage along the first axis. Positioned below the stage is a sensing arrangement that sense the stage's position along the first axis.

Further included in some embodiments of the magnetically levitated stage assembly is a first shock absorption system that is positioned perpendicular to the first motor stator and the second motor stator to enclose a first end of the transportation channel. Also included is a second shock absorption system that is positioned parallel to the first shock absorption system.

In some instances, the first portion of the first hysteresis motor and the first portion of the second hysteresis motor each comprise a flux-biasing structure. This flux-biasing structure can, in some embodiments, include a permanent magnet, a main stator, a yaw control stator and a stator back. The main stator can comprise one or more lumped windings that can be serially connected to form a three-phase motor, and one or more stator elements that can include stator teeth.

The yaw control stator can include one or more lumped windings that can be serially connected to for a five-phase motor.

The magnetically levitated stage assembly, in other embodiments, can have a stage that comprises a second portion of the first hysteresis motor that is a hysteresis secondary, and a second portion of the second hysteresis motor that also can be a hysteresis secondary. The first hysteresis motor can therefore comprise the second portion of the first hysteresis motor magnetically coupled to the first portion of the first hysteresis motor, while the second hysteresis motor comprises the second portion of the second hysteresis motor magnetically coupled to the first portion of the second hysteresis motor.

In some embodiments the sensing arrangement of the magnetically levitated stage assembly comprises one or more magnetic encoders. These magnetic encoders can be a Hall effect sensor or a magnetoresistance sensor. Additionally, the one or more magnetic encoders can sense a change in the position of the stage along the first axis and generate positional feedback describing the change. The first hysteresis motor and the second hysteresis motor can operate in response to the positional feedback generated by the magnetic encoders. In some instances, a processor can use the positional feedback to control operation of the first and second hysteresis motors.

The magnetically levitated stage assembly can, in some embodiments, have a first and second motor stator that comprises one or more rows of biasing magnets. These biasing magnets can impart a force to the stage to levitate the stage within the transportation channel.

In yet another embodiment, the first and second hysteresis motors use electromagnetic torque to drive the stage along the first axis.

Also described herein is an embodiment of a lithography system that comprises a processor and a magnetically levitated stage assembly for transporting a reticle from a first position to a second position. The magnetically levitated stage assembly can include a first motor stator that has a first portion of a first hysteresis motor, and a second motor stator that has a first portion of a second hysteresis motor. The second motor stator can be positioned on the opposite side of the first motor stator to create a transportation channel between the first and second motor stator. A stage that moves within the transportation channel along a first axis and supports and transports a reticle from a first position to a second position. The first portion of the first hysteresis motor and the first portion of the second hysteresis motor are coupled to the stage to drive the stage along the first axis. Positioned below the stage is a sensing arrangement for sensing the position of the stage along the first axis.

In some embodiments, the lithography system can comprise a closed area that has a pressure less than 100 nanopascals. The magnetically levitated stage assembly can reside within this closed area.

In other embodiments, the lithography system can include an ultra-violet light source that illuminates a photoresist coating on the reticle. This ultra-violet light source can comprise an extreme ultra-violet light source.

In still other embodiments, the processor can receive position feedback from the sensing arrangement that indicates the position of the stage along the first axis. In response to this positional feedback, the processor can operate the first hysteresis motor and the second hysteresis motor.

BRIEF DESCRIPTION OF THE DRAWINGS

The foregoing features may be more fully understood from the following description of the drawings.

FIG. 5 illustrates a cross-sectional view of the MLLS of FIG. 1A.

FIG. 6 illustrates a cross-sectional view of a portion of an alternate embodiment of a magnetically levitated linear motor (MLLM) having magnets in a position different from that shown in FIG. 5.

FIG. 9 illustrates a cross-sectional view of a portion of an alternate embodiment of a MLLM having a main stator on top and bottom and permanent magnet bias in a center region.

FIG. 10 illustrates a cross-sectional view of a portion of an alternate embodiment of a MLLM having permanent magnets at rim of a suspension stator (yaw control station).

DETAILED DESCRIPTION

Figure 1A:
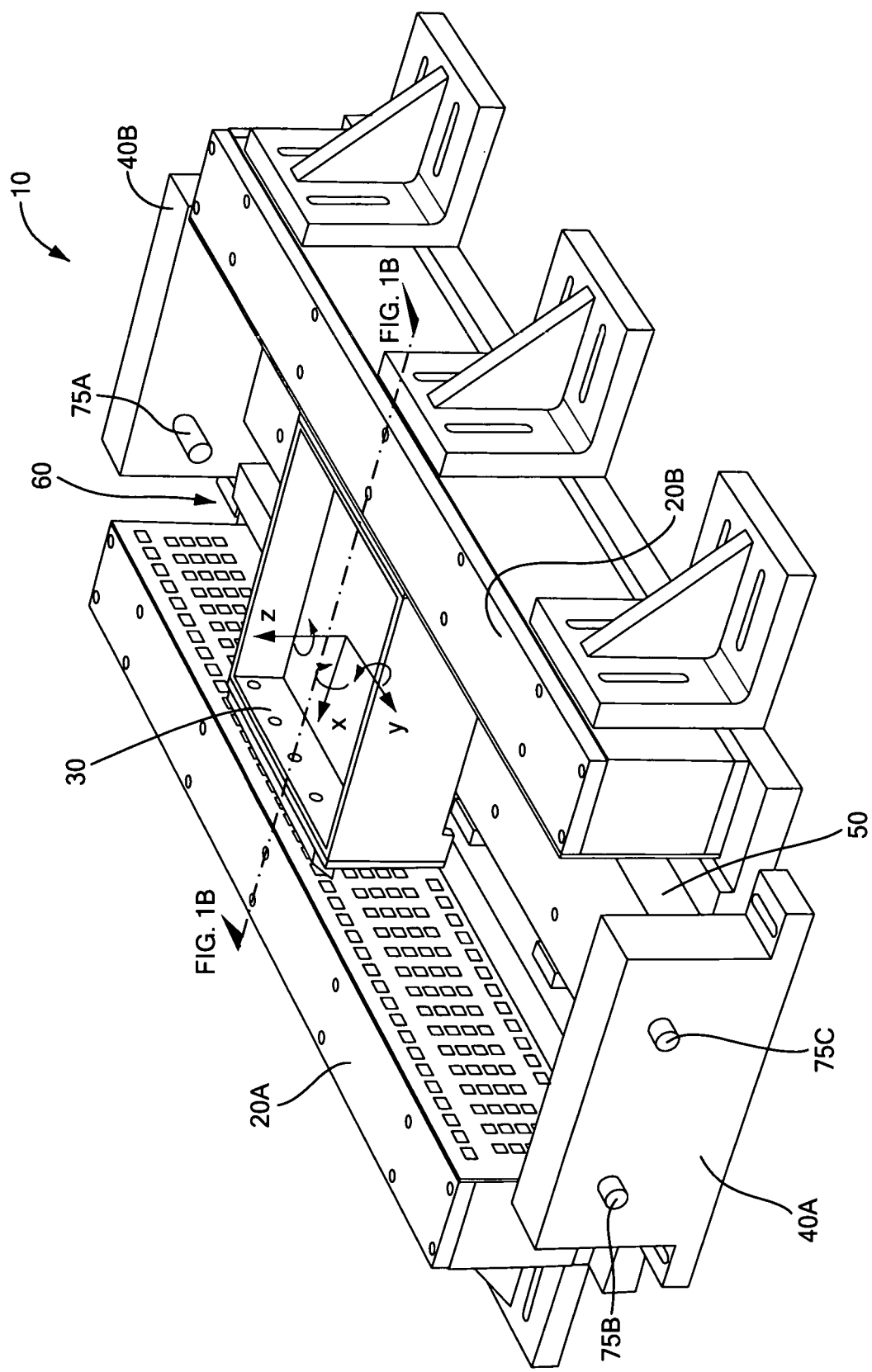
FIG. 1A illustrates an isometric view of a magnetically levitated linear stage (MLLS).

Before proceeding with a discussion of the concepts, systems, device, circuits and techniques described herein, some introductory concepts and terminology are first provided.

Various embodiments of the concepts systems and techniques are described herein with reference to the related drawings. Alternative embodiments can be devised without departing from the scope of the described concepts. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to element or structure "A" over element or structure "B" include situations in which one or more intermediate elements or structures (e.g., element "C") is between element "A" and element "B" regardless of whether the characteristics and functionalities of element "A" and element "B" are substantially changed by the intermediate element(s).

The following definitions and abbreviations are to be used for the interpretation of the claims and the specification.

As used herein, the terms "comprises," "comprising," "includes," "including," "has," "having," "contains" or "containing," or any other variation thereof, are intended to cover a non-exclusive inclusion. For example, a method, article, or apparatus that comprises a list of elements is not necessarily limited to only those elements but can include other elements not expressly listed or inherent to such method, article, or apparatus.

Additionally, the term "exemplary" is used herein to mean "serving as an example, instance, or illustration." Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

References in the specification to "one embodiment," "an embodiment," "an example embodiment," or variants of such phrases indicate that the embodiment described can include a particular feature, structure, or characteristic, but every embodiment can include the particular feature, structure, or characteristic. Moreover, such phrases are not necessarily referring to the same embodiment. Further, when a feature, structure, or characteristic is described in connection knowledge of one skilled in the art to affect such feature, structure, or characteristic in connection with other embodiments whether or not explicitly described.

Furthermore, it should be appreciated that relative, directional or reference terms (e.g. such as "above," "below," "left," "right," "top," "bottom," "vertical," "horizontal," "front," "back," "rearward," "forward," etc.) and derivatives thereof are used only to promote clarity in the description of the figures. Such terms are not intended as, and should not be construed as, limiting. Such terms may simply be used to facilitate discussion of the drawings and may be used, where applicable, to promote clarity of description when dealing with relative relationships, particularly with respect to the illustrated embodiments. Such terms are not, however, intended to imply absolute relationships, positions, and/or orientations. For example, with respect to an object or structure, an "upper" surface can become a "lower" surface simply by turning the object over. Nevertheless, it is still the same surface and the object remains the same. Also, as used herein, "and/or" means "and" or "or", as well as "and" and "or." Moreover, all patent and non-patent literature cited herein is hereby incorporated by references in its entirety for all purposes.

Similarly, it should be appreciated that references to specific magnet polarities (i.e. north (N), south (S)) are relative and are used only to promote clarity in the description of the figures. Such terms are not intended as, and should not be construed as, limiting. Example embodiments using specific magnet polarities (i.e., specific magnet orientations) are simply used to facilitate discussion of the drawings and may be used, where applicable, to promote clarity of description when dealing with relative relationships, particularly with respect to the illustrated embodiments. Such terms are not, however, intended to imply absolute relationships, positions, and/or orientations. For example, one or more magnets positioned with a certain north/south magnetic polarity can be reversed simply (e.g. by reversing a physical orientation of a magnet or using any other technique known to those of ordinary skill in the art to change the polarity of a magnetized or magnetizable element). When reversing the position of magnetic poles, it may be necessary to reverse the positions of multiple magnets to maintain an operable embodiment. After reading the description provided herein, one of ordinary skill in the art will appreciate how to position magnetics such that magnet poles are aligned/oriented so as to result in operable embodiments.

The terms "disposed over," "overlying," "atop," "on top," "positioned on" or "positioned atop" mean that a first element, such as a first structure, is present on a second element, such as a second structure, where intervening elements or structures (such as an interface structure) may or may not be present between the first element and the second element. The term "direct contact" means that a first element, such as a first structure, and a second element, such as a second structure, are connected without any intermediary elements or structures between the interface of the two elements.

As used herein, the term "degree of freedom" refers to one or more parameters used to define a position or orientation of a moving stage in space. Motion of a moving stage through a space, or the translation and rotation of a moving stage, can have multiple degrees of freedom along one or more axes within three-dimensional space.

As used herein the term "linear motor" refers to a motor which can generate thrust forces in the motion direction as well as magnetic suspension controlling forces or torques in some or all other degrees of freedoms.

As previously mentioned, device and IC fabrication using complex lithography machines often requires movement of a photomask or reticle through the machine. Depending on the complexity of a particular device, reticles used to create the device may be passed through the lithography machine multiple times to expose the device's substrate to one or more reticles, one or more times. In some embodiments, a magnetically levitated linear stage (MLLS) can be used to transport a photomask or reticle from a storage position within the lithography machine or tool, to a scanning position within the lithography machine. While in the scanning position, a light source such as a nanometer wavelength light source (i.e. UV or EUV) can illuminate the reticle to cast a pattern onto a wafer. It can be appreciated that the light source can have any wavelength of light. The light source and any associated components required to cast the reticle's pattern onto the wafer can be encompassed within a lithography machine. Similarly, the MLLS can also be encompassed within a lithography machine, system or tool. In some instances, the MLLS can be situated in a closed space, area or environment within a lithography machine. This closed area can be a vacuum or an ultra-high vacuum having a pressure lower than 100 nano-pascals. In embodiments where the closed area is an ultra-high vacuum, the ultra-high vacuum pressure can be achieved by using a vacuum pump to pump gas out of the closed space within the lithography machine.

Figure 1B:
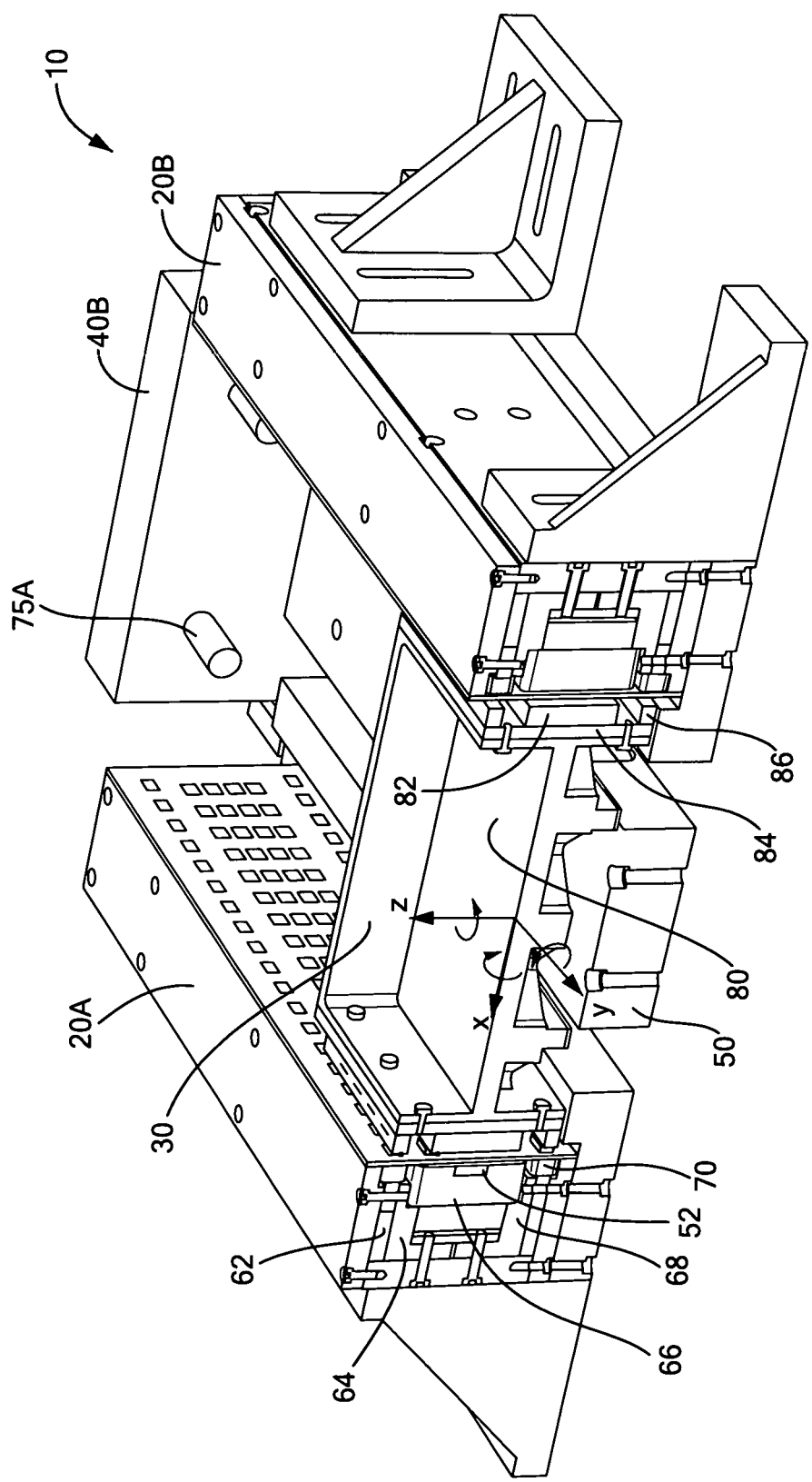
FIG. 1B illustrates a cross-sectional view of the stage of FIG. 1A.

Illustrated in FIGS. 1A and 1B are aspects of a magnetically levitated linear stage (MLLS) assembly 10 that includes a moving stage 30 that can be magnetically driven by one or more hysteresis motors along an axis parallel to a transportation channel 60 within the assembly 10. Disposed on either side of the channel 60 are motor stators 20A and 20B comprising portions of hysteresis motors that facilitate movement of the moving stage 30 through the transportation channel 60. Disposed on either end of the channel 60 are end-stops 40A and 40B that provide a degree of shock absorption via one or more shock absorbers 75A, 75B, 75C installed on the end-stops 40A, 40B. Installed within the transportation channel 60, under the moving stage 30, between the stators 20A, 20B and between the end-stops 40A, 40B, is a linear arrangement of magnetic encoders 50 that can be used to determine the position of the moving stage 30 along the y axis.

Further referring to FIG. 1A, and in more detail, the moving stage 30 can move, either by translation along a trajectory or rotation around an axis, through one or more degrees of freedom as defined in relation to the coordinate system illustrated in FIG. 1A. For example: the stage 30 can move up and down, or elevate and heave, along the z-axis; the stage 30 can move left and right along the x-axis; and the stage 30 can move forward and backward along the y-axis. In addition to movement of the stage 30 along a trajectory, rotation of the stage 30 can occur about one or of the axes. For example: the stage 30 can swivel or yaw about the z-axis; the stage 30 can tilt or pitch about the x-axis; and the stage 30 can pivot or roll about the y-axis.

Passive movement of the stage 30 can include moving the stage 30 or maintaining the stage's position without feedback control, whereas active movement of the stage 30 requires feedback control to move the stage 30 and maintain the stage's position. Active movement can be accomplished using feedback from sensors within the system 10 and the main stator 66 (shown in FIG. 1B), whereas passive movement can be accomplished using flux generated by permanent magnets within the stator assemblies 20A, 20B and controlled by the yaw control stator yoke 70. In some embodiments, the stage's magnetically-aided movement can be passively achieved within at least some degrees of freedom and in particular, the stage 30 can be passively moved or maintained in the z-, $\theta_x$-, and $\theta_y$-directions. In other embodiments, the stage's magnetically-aided movement can be actively achieved within at least some degrees of freedom. In particular, the stage 20 can be actively moved or maintained in the x- and $\theta_z$-directions.

Still referring to FIG. 1A, in some embodiments, the transportation channel 60 can be any three-dimensional space between the motor stators 20A, 20B. The stage 30 can move through and within the transportation channel 60 using one or more hysteresis motors. While FIG. 1A illustrates a transportation channel 60 comprising end-stops 40A, 40B on either end, in other embodiments the transportation channel 60 may not be bounded by end-stops, but rather may be open on either end. Furthermore, while the floor of the transportation channel 60 may comprise a top surface of an array of sensors or encoders 50, in other instances the floor of the transportation channel 60 may be unbound.

Parallel end-stops 40A, 40B can bound the transportation channel 60 on either end. In some embodiments the end-stops 40A, 40B can be referred to as shock absorption assemblies, systems or units. These end-stops 40A, 40B, or shock absorption systems, can have one or more shock absorbers 75A, 75B, 75C installed therein. In some embodiments the shock absorbers 75A, 75B, 75C can be installed on the surface of the end-stops 40A, 40B, while in other embodiments the shock absorbers 75A, 75B, 75C can be installed within the end-stops 40A, 40B such that a portion of the shock absorbers are embedded within the end-stops. Although FIG. 1A illustrates two shock absorbers 75B, 75C on one end-stop 40A and one shock absorber 75A on the other end-stop 40B, any number of shock absorbers can be installed on or within the end-stops. In some instances, rather than use discrete shock absorbers, the entire end-stop can comprise a shock absorbent material or a layer or shock absorbent material. Furthermore, while FIGS. 1A and 1B illustrate round shock absorbers, the shock absorbers can have any geometry.

Shock absorbers 75A, 75B, 75C can be used to absorb or dampen the vibration caused by the stage 30 reaching an end of the transportation channel 60. The ability for each shock absorber to absorb shock can be related to characteristics of the shock absorber such as the shock absorber's material, dimensions, geometry and placement on or within its associated end-stop. By facilitating vibration dampening, the shock absorbers reduce any vibration that might be caused by the stage's movement towards the end of the transportation channel 60 and therefore help maintain a substantially vibration-free environment within the MLLS system 10. The maximum acceleration for the stage 30 is 500 mm/s$^2$ and the positional accuracy for the stage 30 is a tolerance of plus or minus 500 μm of movement. Any vibration of the stage 30 cannot exceed the stage's maximum acceleration and should, in most embodiments, not cause the stage 30 to change its position more than 500 μm.

The system 10 can include an arrangement of sensors or magnetic encoders 50 which can be part of a larger sensing system for measuring the stage's motion along the y axis. Movement of the stage's position within its other degrees of freedom can be measured using a laser interferometer (not shown). In some embodiments, these encoders 50 can be magnetic rotary encoders or linear magnetic encoders that use the Hall effect or magnetoresistance to sense a change in a magnetic field. The magnetic field change sensed by the magnetic encoders 50 can be used to sense or determine a position of the stage 30 through the transportation channel 60, and in some instances, the position of the stage 30 along the y axis of motion. Determining the position of the stage 30 along the y axis and within the transportation channel 60 permits operation of the hysteresis motors partially enclosed within the stators 20A, 20B. For example, the magnetic encoders 50 can provide feedback to the hysteresis motors which is then used by the hysteresis motors to control movement of the stage 30 and in some embodiments, determine an amount and direction of thrust to impart to the moving stage 30 via an electromagnetic torque created by the first and second hysteresis motors. Although y directional displacement of the stage 30 can be measured using magnetic encoders, in some instances, the laser interferometer can also be used to measure the y directional displacement of the stage 30 throughout the channel 60.

While FIGS. 1A and 1B illustrate a linear arrangement of magnetic encoders 50 located below the stage 30, in other embodiments the magnetic encoders 50 can be arranged in any ordered or unordered fashion and in any geometry or shape. Furthermore, in one embodiment, the system 10 can include a sensor system comprising two linear and parallel rows of magnetic encoders 50 arranged along the direction of movement of the stage 30. In this embodiment, the magnetic encoders 50 can measure the y displacement of the stage 30. In other embodiments, the system can comprise a single row of magnetic encoders 50, or more than two rows of magnetic encoders 50.

In addition to the magnetic encoders 50 used to measure the position or motion of the stage 30 in the y-degree of freedom, the sensing system of the MLLS 10 can comprise a plurality of different sensors to measure the stage's motion in the x-, and $\theta_z$-degrees of freedom. To measure the x-directional air gap lengths at different y-axis position, one or more, and in some cases twenty, optical displacement sensors 52 can be arranged along the stators 20A, 20B. It should, however, be appreciated that in other embodiments, other sensors including but not limited to airgap sensors, e.g. eddy-current sensors, induction sensors, half effect sensors, etc. may also be used. In some instances, using the signals or feedback from the X and Y sensors (i.e. the optical displacement sensors and magnetic encoders 50), the z-axis rotational displacement of the stage can be calculated.

In an alternative embodiment of the system 10, a single row of magnetic encoders 50 is used rather than the two rows of magnetic encoders 50 depicted in FIG. 1A. In this embodiment, the base 80 of the stage 30 can include one array magnets that together with a proximate situated read-head, comprises a magnetic encoder. Motion of the array of magnets relative to the read-head senses the position of the stage 30 along the magnet array.

Illustrated in FIG. 1B is a cross sectional view of the assembly 10 illustrated in FIG. 1A such that a cross section is made along a line demarcated in FIG. 1A as "FIG. 1B". The cross-sectional view of the MLLS system 10 further demonstrates elements within the first stator assembly 20A such as a biasing or permanent magnet 62 used in the stator assembly 20A as a flux-biasing structure, a stator back iron 64, a main stator 66, a spacer 68 and a yaw control stator 70. It should be appreciated that the second stator assembly 20B can comprise the same elements as those included in the first stator assembly 20A, and that descriptions of the elements within the first stator assembly 20A should be applied to similar elements within the second stator assembly 20B. Also illustrated in 1B are elements of the stage 30 including the base 80 of the stage, the suspension secondary 86, the stage back iron 84 and the hysteresis secondary 82

Further referring to FIG. 1B, the first and second motor stators 20A, 20B can include a stator housing that houses aspects of a hysteresis motor which comprises a flux-biasing structure. In some embodiments, the stators 20A can house a flux-biasing structure that includes a permanent magnet 62, a yaw control stator 70, a main stator 66 and a stator back iron 64. While the stators of FIG. 1B illustrate the use of two rows of permanent magnets 62, in other embodiments a single row of permanent magnets 62 may be used. Furthermore, while the permanent magnets 62 are placed along a horizontal plane in the stator assemblies 20, in other embodiments the permanent magnets 62 can be placed elsewhere on the stator assembly 20.

Figure 2A:
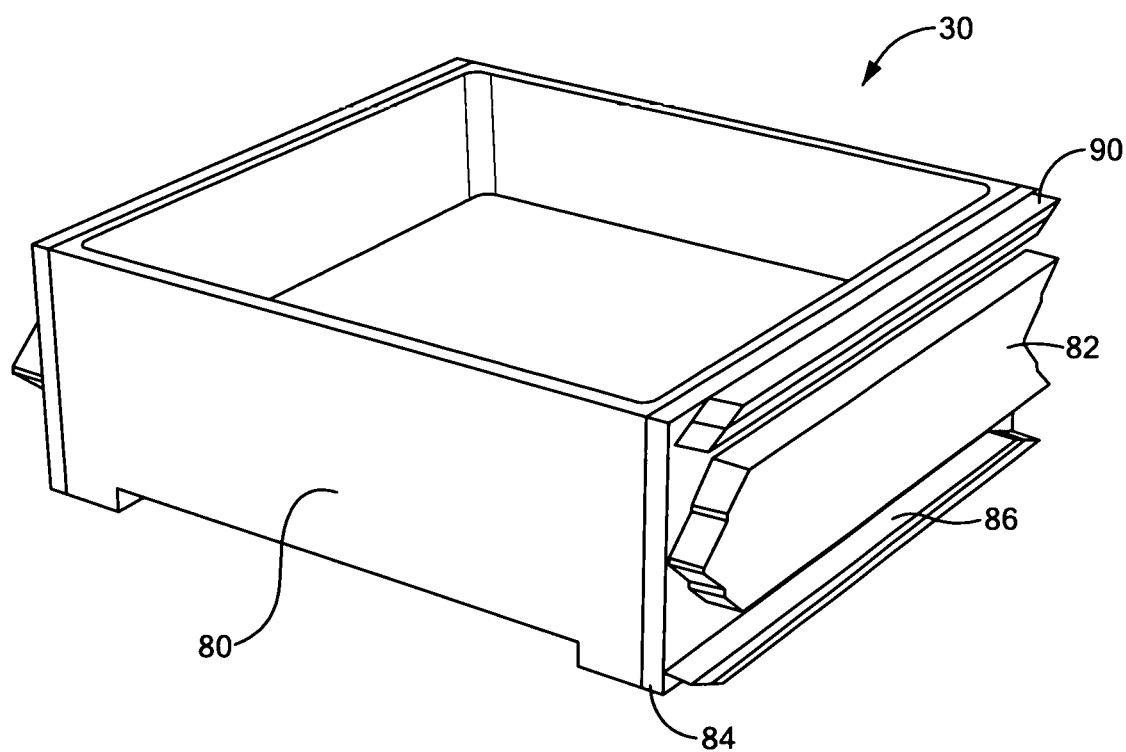
FIG. 2A illustrates portions of a stage.
Figure 2B:
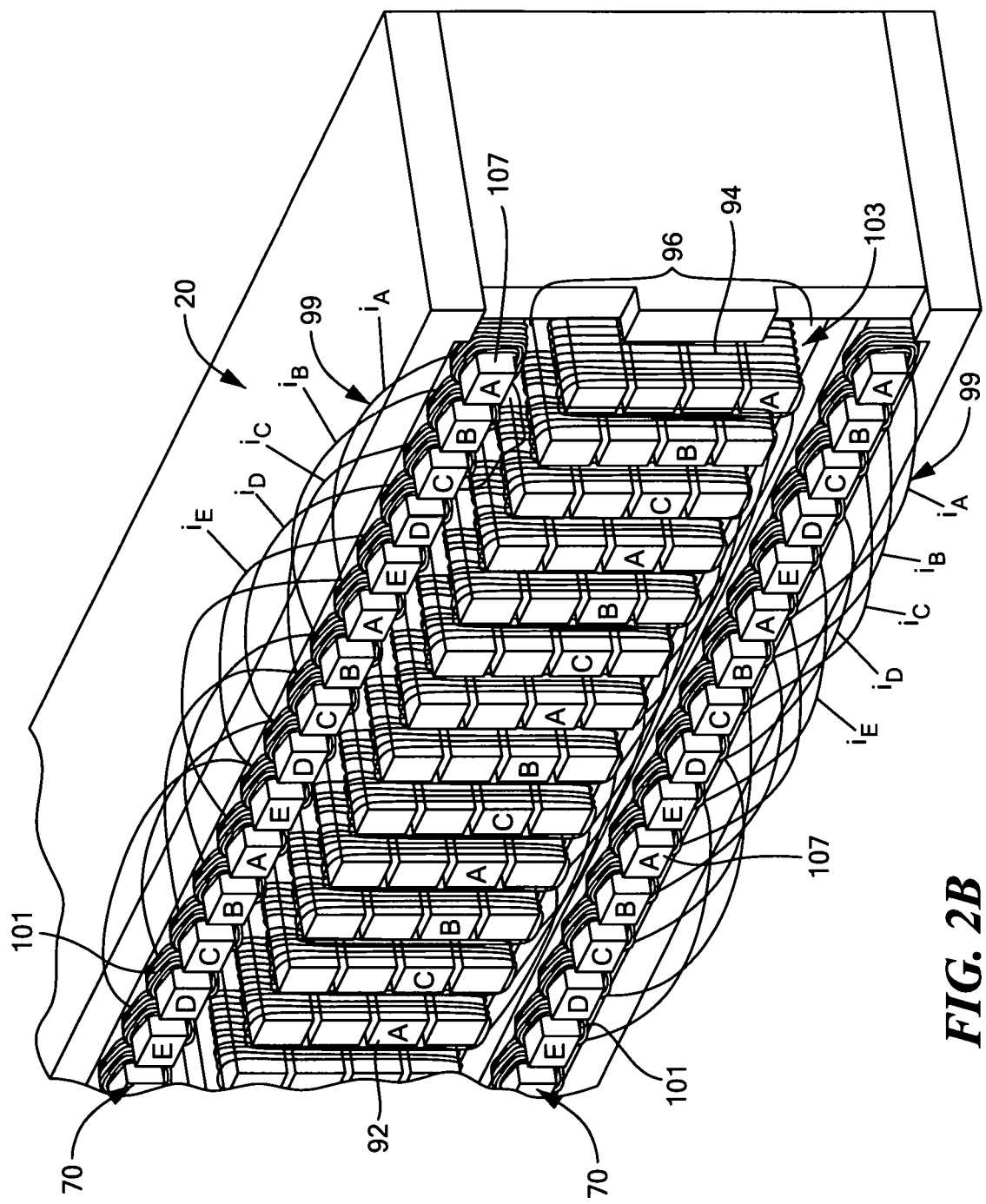
FIGS. 2B-2D illustrates portions of a stator assembly.
Figure 2C:
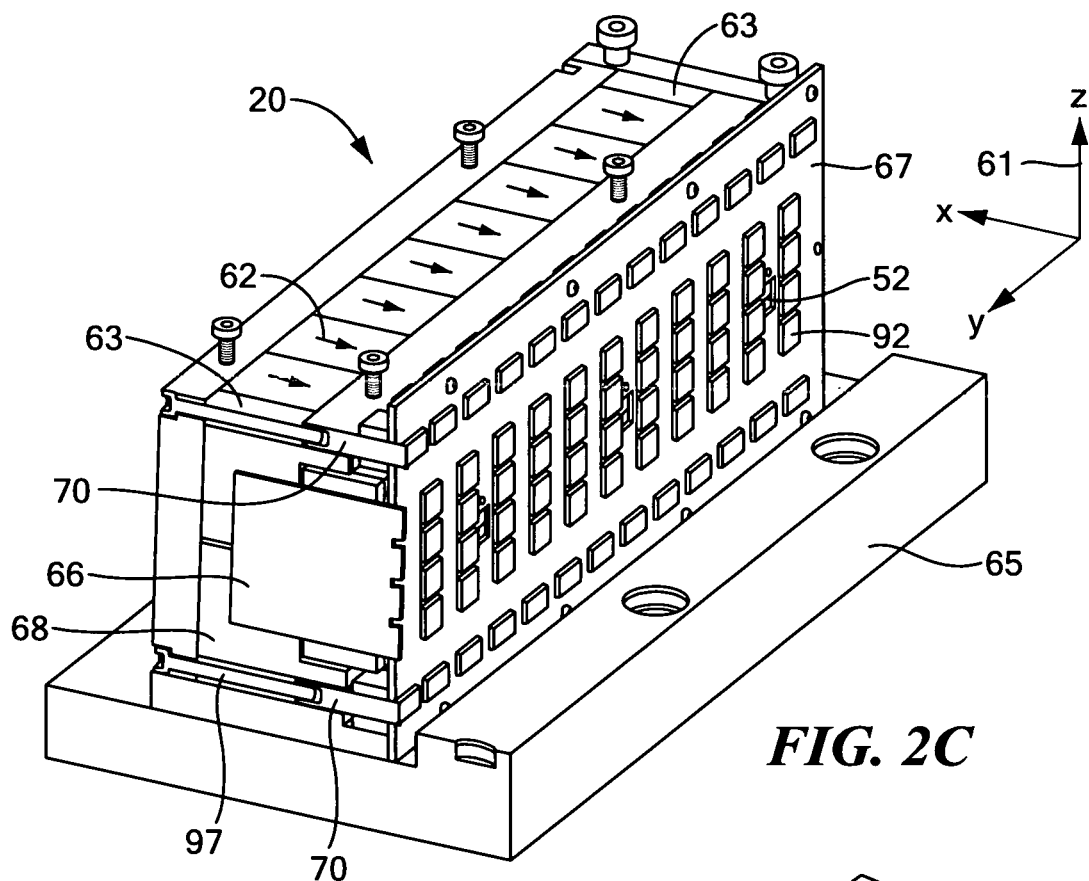
Figure 2D:
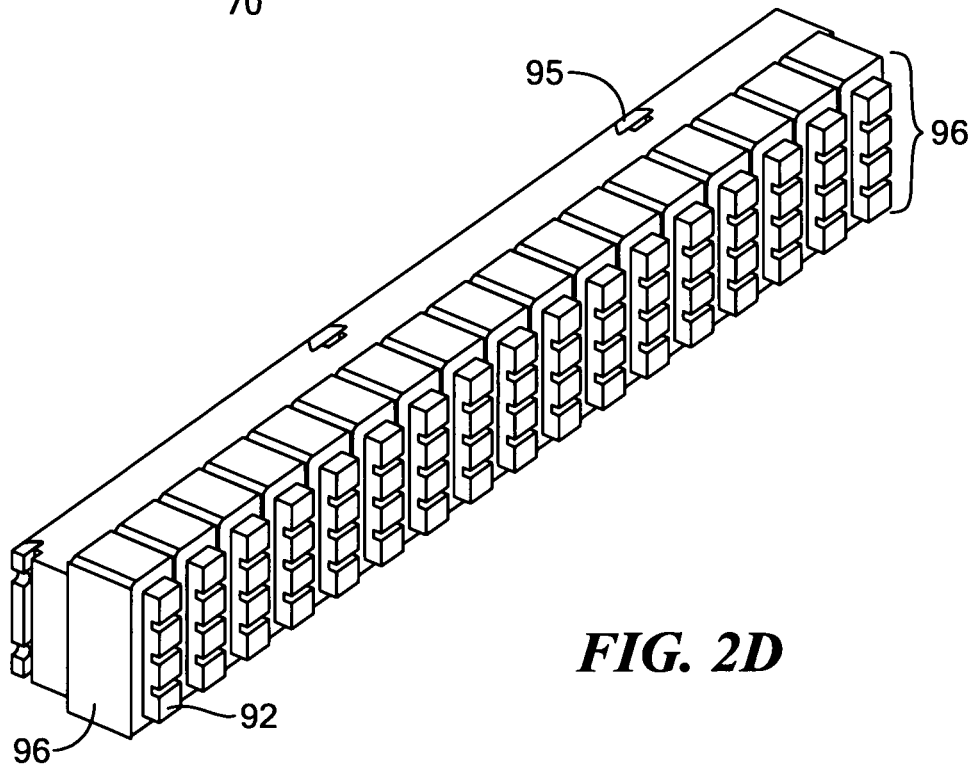

The main stator 66, in some embodiments, can include aspects of a hysteresis motor including those illustrated in FIGS. 2B-2D. For example, the main stator 66 can include one or more lumped stator coil elements 96 comprising one or more stator teeth 92 and one or more lumped windings 84. In some embodiments, the main stator 66 can be referred to as a first part of a hysteresis motor, where this first part creates a magnetic field. The second part of the hysteresis motor can comprise a hysteresis motor secondary 82 attached to or integrated into the stage 30. When the first part of the hysteresis motor generates a magnetic field, the generated field magnetically couples to the hysteresis motor secondary 82 of the stage 30 to create a magnetic flux that creates thrust in a direction along the y axis.

It should, of course, be appreciated that in embodiments, a plurality of stator assemblies 20 may be used. For example, in some embodiments it may be desirable or necessary to use top, bottom and left and right-side stator assemblies 20. Other combinations may also be used depending upon the needs of an application of the system 10. Using four (4) stators requires higher system complexity and thus is more expensive, but the larger number of stators 20 allows active control in the vertical directional magnetic levitation therefore simplifying the process required to bias the gravity. Factors to consider in deciding how many stators 20 to use in a particular application can include the cost and complexity of including additional stators 20.

Although not depicted in FIG. 1A or 1B, the magnetically levitated linear stage (MLLS) assembly 10 can further include a processor or central processing unit comprising any electronic component capable of receiving sensor feedback and using that feedback to control the amount of current or voltage imparted to aspects of the MLLS assembly 10. This processor can be a microcontroller or microprocessor, control station, computer, and can have the ability to execute programmable code. In some embodiments, the processor can be included within the MLLS assembly 10, in other embodiments the processor can be external to the MLLS assembly 10 such that sensor feedback from the MLLS assembly 10 is transmitted to the processor and used by the processor to control the voltage or current of various aspects of the stator assembly 20.

Now referring to FIG. 2A, illustrated are elements of the stage 30 including the base 80 of the stage, the hysteresis secondary 82, a suspension secondary 90, 86 and the stage back iron 84. The suspension secondary 90, 86 can be referred to as a yaw control secondary and can be disposed on and mechanically coupled to the stage base 80 together with the hysteresis secondary 82. The suspension secondary can have a first part 86 and a second part 90. It should be appreciated, however, that in some embodiments any one of the suspension secondary 90, 86 and the hysteresis motor secondary 82 can be integrated into the stage base 80 such that the stage base 80, suspension secondary 90, 86 and the hysteresis motor secondary 82 form a monolithic structure. While FIG. 2A illustrates a single view of the stage 30, it can be appreciated that elements on one side of the stage 30 are also present on the opposite side of the stage 30. For example, there is a stage back iron 84, a hysteresis secondary 82 and a suspension secondary 90, 86 on either side of the stage 30.

The base 80 of the stage 30 can be manufactured or otherwise provided from aluminum, steel or any other suitable material. In many instances, the base 80 may be provided having structural characteristics (e.g. manner of support, material(s), deflection characteristics) suitable for supporting a reticle and reducing (and ideally minimizing) interference with illumination of the photoresist on a wafer by a light source of the lithography machine. The light source of the lithography machine can be any light source, however in some embodiments it can be a laser. In other embodiments, the light source can have wavelengths in the range of ultra-violet light (100 nm to 400 nm) or extreme ultra-violet light (10 nm to 100 nm).

In some embodiments, the stage 30 can include one or more hysteresis motor secondaries 82. These hysteresis secondaries 82 can be manufactured from steel, an alloy or any other material having a large magnetic hysteresis such as tool steel, FeCrCo alloy or AlNiCo magnets. Other materials may be used to manufacture the hysteresis secondaries 82, however, those materials should not only have a large magnetic hysteresis, but also a large permeability, which is advantageous for reluctance force generation for magnetic levitation purpose. In an embodiment, the total mass of the stage 30 can be 4.9 kg. While described as hysteresis secondaries 82 herein, these elements of the stage 30 can also be referred to as main motor secondaries 82, or main hysteresis motor secondaries 82.

In some embodiments, the hysteresis motor secondaries 82 of the stage 30 together with the portions of the hysteresis motor included in the stators 20A, 20B, form a first and second hysteresis motor. Stators 20A, 20B of each hysteresis motor are used to produce a synchronous revolving magnetic field within each stator assembly 20A, 20B to create a magnetic flux along the length of the stators. In some instances, a flux-biasing structure within each stator assembly 20A, 20B produces the revolving magnetic field. The hysteresis secondaries 82 act as rotors in that the magnetic field created within each stator assembly 20A, 20B magnetizes its corresponding hysteresis secondary 82 such that a pole is induced within each hysteresis secondary 82. The induced magnetic flux within the hysteresis secondary 82 lags behind the magnetic flux of the stator assembly 20A, 20B such that a torque is produced which propels the stage 30 in a direction along an axis of movement. In some instances, this torque can be referred to as an electromagnetic torque or thrust.

The suspension secondary 90, 86 and the hysteresis motor secondary 82 can, in some instances, further include material that achieves passive damping. This passive damping element, in some embodiments can be inserted into suspension secondary 90, 86 and the hysteresis motor secondary 82 as a separate element. In other instances, the passive damping material can be integrated into the suspension secondary 90, 86 and the hysteresis motor secondary 82.

Illustrated in FIG. 2B is an exemplary embodiment of a partial assembly of the stator assembly 20. The stator assembly 20 can include one or more lumped windings 94 that can be magnetically coupled to one or more groups of stator teeth 92. Together the lumped windings 24 and stator teeth 92 form lumped stator coil elements 96. These stator teeth 92, in some embodiments, can be stator cut outs that improve magnetic levitation of the stage 30 when the hysteresis motor operates. The lumped stator coil elements 96 can be disposed between two parallel arrays of discrete lumped windings 101 which comprise a yaw control stator yoke tooth 107 wrapped with a conducting coil. Together these parallel arrays of windings 101 form the yaw control stator yoke 70.

Further referring to FIG. 2B, while the lumped stator coil elements 96 include vertical groupings of cut outs that form rectangular elements (or teeth) 92, in other embodiments the cut outs can be any regular or irregular geometric shape thereby resulting in teeth having a corresponding regular or irregular geometric shape. Illustrated in this embodiment are columns of four substantially uniformly shaped and sized stator elements or teeth 92. It should be appreciated that each column can include any number of elements or teeth 92 and that the elements or teeth 92 can have any geometric configuration. Each lumped stator coil element 96 comprises a vertical grouping of stator teeth 92. In some instances, each lumped stator coil element 96 can be individually controlled to move the stage 30 along the y axis.

The lumped windings 94 can be also be referred to as the lumped motor coils 94. The current flowing through each individual lumped winding 94 can be separate from the current flowing through a second and different lumped winding 94. In one embodiment, the individual windings 94 can be connected in series to form a three-phase hysteresis motor. Illustrated in FIG. 2B are different hysteresis motor phases 103, where a first motor phase comprises lumped stator coil elements 96 labeled "A" and has a current $i_A$, a second motor phase comprises lumped stator coil elements 96 labeled "B" and has a current $i_B$ and a third motor phase comprises lumped stator coil elements 96 labeled "C" and has a current $i_C$. This three-phase pattern can be repeated along the length of the stator 20A, 20B. Each motor phase includes two or more lumped stator coil elements 96 that are each two additional lumped stator coil elements 96 apart. Although FIG. 2B illustrates serially connected lumped stator coil elements 96, in some embodiments, these individual elements 96 are not connected in series or parallel. Current through the lumped windings 94 can induce a flux through the stator teeth 92 such that the stator teeth 92 can generate directional forces such as controlled shear and normal forces. The shear forces generated by each stator tooth 92 can be used to drive or move the stage along the y-direction, while the normal forces can be used to effectuate magnetic suspension of the stage 30 in the z- and $\theta_y$-direction. Although described herein is a three-phase hysteresis motor, it should be appreciated that the hysteresis motor can comprise any number of phases.

The individual windings 94 and their corresponding stator teeth 92 can be vertically grouped together into lumped stator coil elements 96, as shown in FIG. 2D. When grouped together, each individual winding 94 can be insulated from its associated stator teeth 92.

Disposed on either side of the lumped stator coil elements 96 is a yaw control stator yoke 70 that comprises one or more lumped windings 101. These windings 101 comprise metal cores or teeth 107 wrapped with a conducting wire (i.e. a copper wire) that conducts current and together with the teeth 107, generate a magnetic field. The lumped windings 101 can be serially connected to form a five-phase motor. Illustrated are different motor phases 99, where a first phase comprises lumped windings 101 with a tooth 107 labeled "A" and has a current $i_A$, a second phase comprises lumped windings 101 with a tooth 107 labeled "B" and has a current $i_B$, a third phase comprises lumped windings 101 with a tooth 107 labeled "C" and has a current $i_C$, a fourth phase comprises lumped windings 101 with a tooth 107 labeled "D" and has a current $i_D$, and a fifth phase comprises lumped windings 101 with a tooth 107 labeled "E" and has a current $i_E$. This five-phase pattern is repeated along the length of the stator 20A, 20B. Each phase of the motor includes two lumped windings 101 that are four additional lumped windings apart. Although FIG. 2B illustrates serially connected lumped windings 101, in some embodiments, these individual windings 101 are not connected in series or parallel. The magnetic field created by the yaw control stator yoke 70 induces a magnetic flux in the stage's suspension secondary 86, 90 to stabilize and maintain the levitated position of the stage 30 within the channel 60.

Shown in FIG. 2C is another view of a stator assembly 20 assembly positioned according to the coordinate system 61 depicted. Depicted in FIG. 2C is a stator assembly 20 without the stator housing such that the row of permanent magnets 62 and tube spacers 63 on either side of the row of permanent magnets 62 are visible. The base 97 of the stator assembly 20 resides on an adapting plate 65 that supports the elements of the stator assembly 20 and the sensor holding plate 67 which integrates with the stator teeth 92 and the optical displacement sensors 52. Included within the stator assembly 20 are the yaw control stator yoke 70, the main stator 66, and the spacer 68.

The yaw control stator yoke 70 can have a permanent magnet bias flux caused by the permanent magnets 62 position along the top and the bottom of the stator assembly 20 and perpendicular to a plane defined by the y and z axes of the coordinate system 61, or a plane defined by the surface area of the stator teeth 92 in magnetic communication with the hysteresis secondary 82 of the stage 30. In this configuration, the permanent magnets 62 have a vector of magnetization of the in the cross-motion of a plane defined by the x and y axes of the coordinate system 61 such that the magnetization vector of the magnets 62 is directed in a positive or negative x-direction. The permanent magnets 62 further provide a DC bias magnetic flux in the spacer 68 or air gap which can provide passive magnetic suspension stiffness in the x-direction and the $\theta_z$-direction. The lumped windings 64, in addition to generating a field, also can steer the generated DC magnetic flux to generate a suspension moment in the $\theta_x$-direction.

The permanent magnets 62 can comprise any material and can be of any dimension or geometry required to carry out the aspects of the methods described herein. Illustrated below in Table 1 are exemplary permanent magnet 62 thicknesses and their corresponding passive ($K_z$) and negative ($K_x$) stiffnesses (i.e. stiffness characteristics in the X and Z directions using the coordinate system of FIG. 2C).

TABLE 1

| PM Thickness | Negative Stiffness ($K_X$) | Passive Stiffness ($K_Z$) | ($K_X/K_Z$) |
|---|---|---|---|
| 4 mm | 204 N/mm | 58 N/mm | 3.48 |
| 5 mm | 303 N/mm | 73 N/mm | 4.15 |
| 6.35 mm | 456 N/mm | 94 N/mm | 4.85 |
| 8 mm | 643 N/mm | 118 N/mm | 5.45 |
| 9.525 mm | 821 N/mm | 204 N/mm | 6.03 |

FIG. 2D illustrates another view of an aspect of the main stator 66 which demonstrates the lumped stator coil elements 96, the dove tail shaped nuts 95 and each individual stator tooth 92. As shown, the stator teeth 92 can be vertically grouped into individual stator elements 107 which are then grouped with lumped windings 94 to form lumped stator coil elements 96. Also shown are the insulated lumped windings 94 surrounding the vertical groupings of stator teeth 92.

Figure 3:
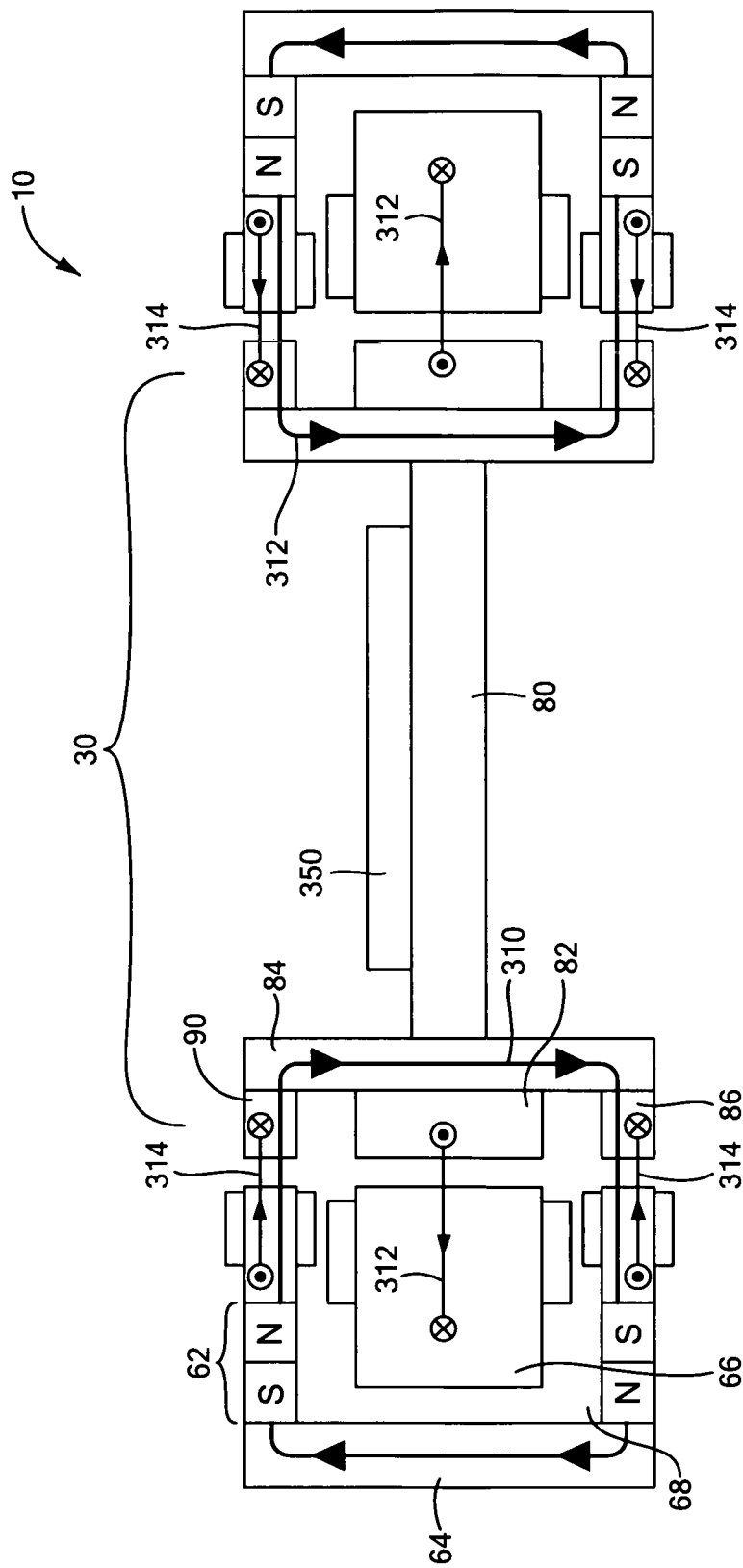
FIG. 3 illustrates a schematic diagram of magnetic fluxes in an MLLS system.

Referring now to FIG. 3, a stage 30 having a payload 350 (i.e. a reticle or photomask) disposed thereon, where the stage 30 is disposed between a pair of stage guides 82, 90, 86 and stator assembly 20 assemblies. Between the stator assemblies 20 and the stage guides 82, 90, 86 is an air gap 320, and within the section of the air gap 320 corresponding to a space between the stator assembly 20 and the hysteresis secondaries 82 two types of magnetic fluxes are generated. The stage 30 may be provided as any rigid body where the vibration frequencies experienced by the stage 30 are so high as compared to a predetermined bandwidth of concern (i.e. the bandwidth of the control loops for magnetic suspensions) that the stage 30 is considered rigid. The payload can be a reticle 350 and can comprise a non-magnetic material and a photoresist coating.

The Illustrative MLLS of FIG. 3 has three kinds of magnetic fluxes in the system. Reference line 310 in FIG. 3 shows the permanent magnet 62 bias flux, which is used to generate passive magnetic suspension force/torque in the z-, $\theta_x$-, and $\theta_y$-directions. These forces can be generated because the fluxes in the air gaps 320 provide restoring forces when the stage 30 is displaced in these directions. This principle has been used previously in slice rotary motors. The reference lines 312 lines in FIG. 3 are the motor fluxes.

It should be appreciated that in the direction of travel of the stage (which is the +/−Y direction using the coordinate system of FIG. 3), the flux can be substantially uniform.

Figure 4B:
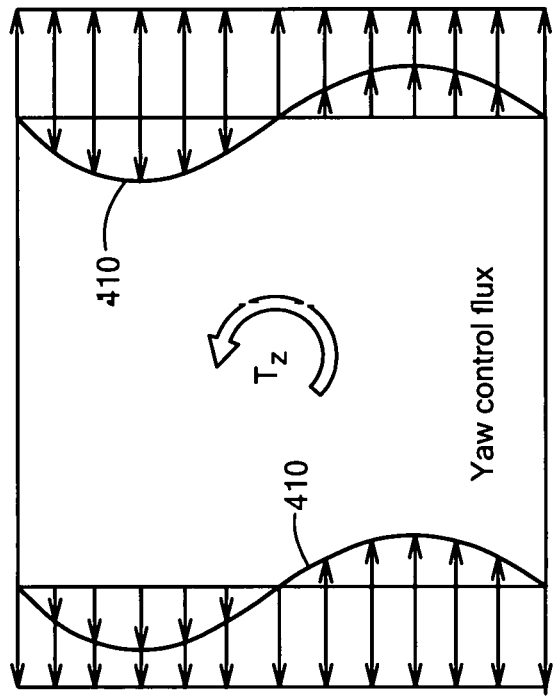
FIG. 4B illustrates a plot of suspension control torque generation.
Figure 4A:
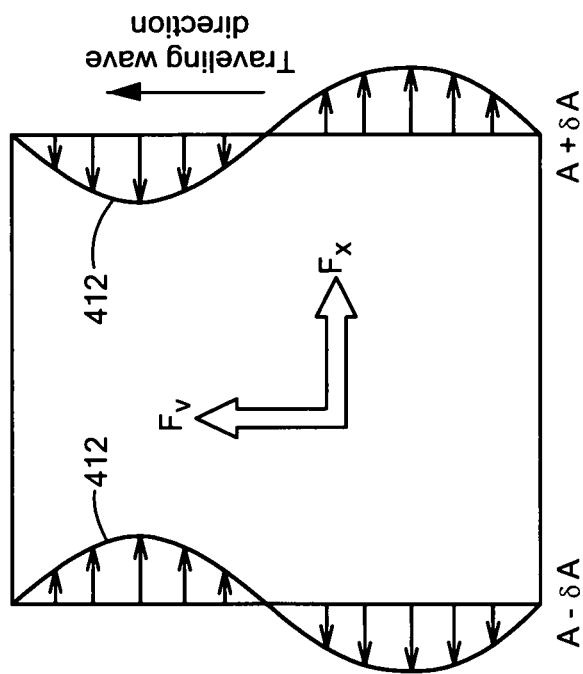
FIG. 4A illustrates a plot of suspension control force and thrust force generation.

Referring now to FIG. 4A as indicated by reference numeral 412 the motor flux forms a traveling wave along the y-direction, and the differential magnitude of the left and right motor fluxes generates x-directional suspension control force.

The reference lines 314 in FIG. 3 and reference lines 410 in FIG. 4B show the yaw suspension control flux which is a flux induced in the secondary suspension 90, 86 by the magnetic field created by yaw control stator yoke 70. In the top and bottom air gaps, the generated yaw suspension control flux steers the permanent magnet bias flux to generate 9z-directional controlling torque. The yaw suspension control flux also forms a traveling wave and is synchronous to the moving stage 30.

There are two types of magnetic fluxes that can exist within the air gap 320, the DC bias magnetic flux 310 generated by the permanent magnets 62, and the magnetic flux generated by the windings 94. Arranging the stators 20 in proximity to the stage 30 in this manner permits the stage 30 to magnetically levitate and be passively suspended in three degrees of freedom. The size of the air gap 320 can be any size capable of providing a desired negative and passive stiffness. In some embodiments the air gap 320 can be in a range of 1 mm to 2 mm, or 1.5 mm to 2 mm, or 1.75 to 2.25. Table 2 illustrates potential air gap sizes and their resultant negative and positive stiffnesses.

TABLE 2

| Air Gap | Negative Stiffness $K_X$ | Passive Stiffness $K_Z$ | $K_X/K_Z$ |
|---|---|---|---|
| 1 mm | 2302 N/mm | 139 N/mm | 10.0 |
| 1.25 mm | 1582 N/mm | 110 N/mm | 8.6 |
| 1.5 mm | 1148 N/mm | 90 N/mm | 7.6 |
| 1.75 mm | 870 N/mm | 74 N/mm | 7.0 |
| 2 mm | 762 N/mm | 62 N/mm | 7.3 |

In this illustrative embodiment, the MLLS uses the hysteresis motors comprising the lumped stator coil elements 96 for the thrust force generation. When the motor windings 94 are excited, the induced magnetization in the hysteresis secondary 82 lags behind the stator field because of the magnetic hysteresis in the hysteresis secondary 82 thereby generating a thrust force. When the stage 30 is operating asynchronously, eddy currents in the hysteresis secondaries 82 can also contribute to the thrust force generation. Position control for the moving stage uses the field-oriented control method, as is introduced in Zhou L, Gruber W, Trumper D L., *Position Control for Hysteresis Motors: Transient-time Model and Field-Oriented Control*, IEEE Trans on Ind Appl. 2018.

The magnetic suspension performance of the stage 30 in different degrees of freedom is simulated via finite element analysis (FEA). Table 3 shows the simulated passive magnetic suspension stiffnesses in passive levitated degrees of freedom. The corresponding natural frequencies are also presented.

TABLE 3

| DOF | Pass. Stiffness | Natural Freq. |
|---|---|---|
| z (vertical) | 94 N/mm | 21 Hz |
| $\theta_y$ (roll) | 529 N/rad | 16 Hz |
| $\theta_X$ (pitch) | 242 rad | 17 Hz |

The thrust force generation can also be simulated. Finite element analysis shows that the thrust force at 4 A/mm$^2$ in the windings at 20 Hz is 6 N, which satisfy the acceleration requirement (1 m/s$^2$) for the reticle transportation stage 30.

Referring now to FIGS. 5-10, illustrated in these figures are various configurations of a magnetically levitated linear motor (MLLM) used within the system 10 to propel the stage 30 along the y axis. Illustrated in each of FIGS. 5-10 are two stator assemblies 20 for magnetically propelling a stage 30 through a channel 60 and causing the stage 30 to magnetically levitate within that channel 60. Each stage 30 is separated on either side from a stator assembly 20 by an air gap 320.

Illustrated in FIG. 5 is a depiction of the system described in FIGS. 1A and 1B, where the elements within the system are arranged according to a coordinate system 510. The elements depicted on one side of a dividing line 501 shown in FIG. 5 are mirrored on the other side of the dividing line 501 such that the system 10 (FIG. 1) is symmetrical about the line 501. Shown are two sets of permanent magnets 62 disposed in the x-y plane and having a length in the direction of the y-axis, which is parallel to the base 97 of the stator assembly 20. A set of two parallel permanent magnets 62 are located along the top of the stator assembly 20, and a second set of two parallel permanent magnets 62 are located along the bottom of the stator assembly 20.

FIG. 6 illustrates an alternate embodiment of a MLLM having magnets 62 in a position different from that shown in FIG. 5, where the elements within the system 10 (FIG. 1) are arranged according to a coordinate system 610. The elements depicted on one side of a dividing line 601 shown in FIG. 6 are mirrored on the other side of the dividing line 601 such that the system 10 (FIG. 1) is symmetrical about the line 601. Within this particular embodiment, two permanent magnets 62A, 62B are installed along the back of the stator assembly 20 such that the length of the permanent magnets 62A, 62B runs parallel to the y-z plane in the direction of the y-axis, which is perpendicular to the base 97 of the stator assembly 20. The permanent magnets 62A, 62B are separated by a space such as the aluminum spacer 68 illustrated in FIG. 1B, and the polarity of each permanent magnet 62A, 62B runs from south to north in the positive z-direction.

Figure 7:
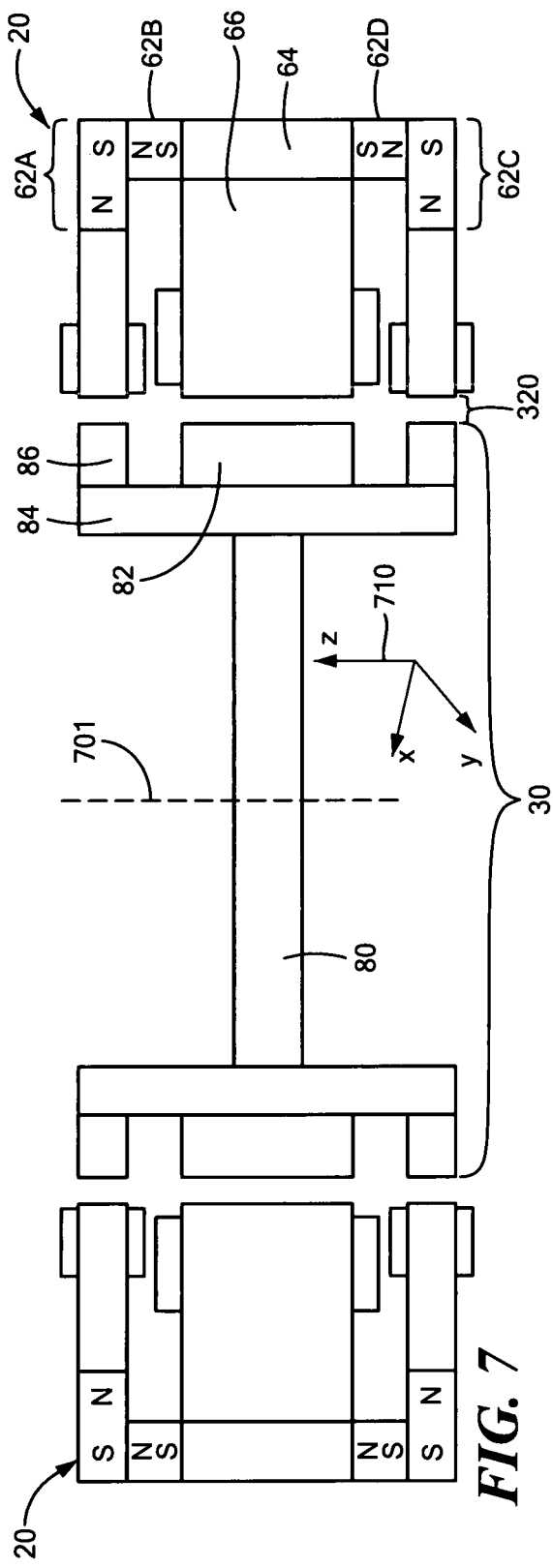
FIG. 7 illustrates a cross-sectional view of a portion of an alternate embodiment of a MLLM having four (4) rows of permanent magnets on each stator.

FIG. 7 illustrates an alternate embodiment of a MLLM having four (4) sets of permanent magnets 62A-D on each stator assembly 20. The elements depicted on one side of a dividing line 701 shown in FIG. 7 are mirrored on the other side of the dividing line 701 such that the system 10 (FIG. 1) is symmetrical about the line 701, and the elements within the system 10 (FIG. 1) are arranged according to a coordinate system 701. There can be two pairs of permanent magnets 62A-B, 62C-D such that each pair of permanent magnets includes two rows of permanent magnets arranged perpendicularly to each other in a Halbach configuration.

In FIG. 7, one set of magnets 62A-B includes a first magnet 62A arranged along the top of the stator assembly 20 such that the length of the magnet 62A runs parallel to the x-y plane in the y-direction, which is parallel to the base 97 of the stator assembly 20. The first magnet is 62A arranged such that its polarity runs from south to north, where the southern side of the magnet is positioned along the back of the stator assembly 20. The second magnet 62B is arranged along the back of the stator assembly 20 such that the length of the magnet 62B runs parallel to the y-z plan in the y-direction, which is perpendicular to the base 97 of the stator assembly 20, and the second magnet 62B is arranged perpendicularly to the first magnet 62A. The polarity of the second magnet 62B is arranged such that the north pole of the second magnet 62B is physically proximate to the south pole of the first magnet 62A.

The second set of magnets 62C-62D includes a first magnet 62C arranged along the bottom of the stator assembly 20 such that the length of the magnet 62C runs parallel to the x-y plane in the y-direction, which is parallel to the base 97 of the stator assembly 20. The first magnet is 62C arranged such that its polarity runs from south to north, where the south pole of the magnet is positioned along the back of the stator assembly 20. The second magnet 62D is arranged along the back of the stator assembly 20 such that the length of the magnet 62D runs parallel to the y-z plan in the y-direction, which is perpendicular to the base 97 of the stator assembly 20, and the second magnet 62D is arranged perpendicularly to the first magnet 62C. The polarity of the second magnet 62D is arranged such that the north pole of the second magnet 62D is physically proximate to the south pole of the first magnet 62C.

Figure 8:
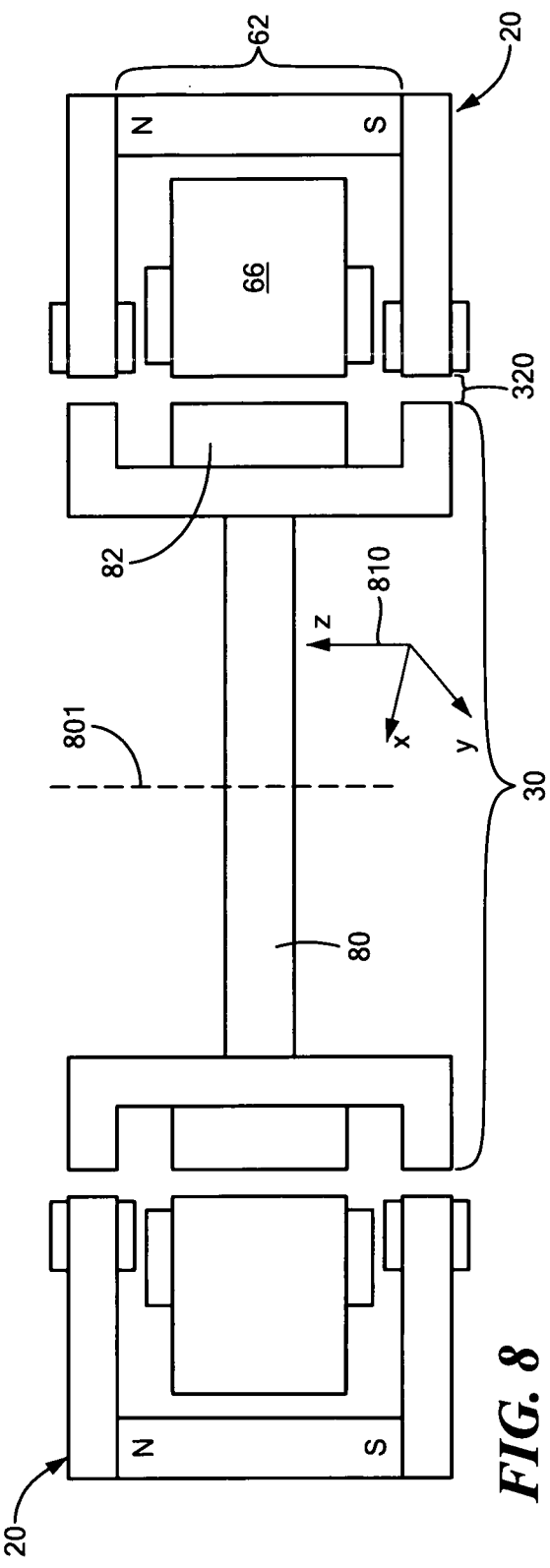
FIG. 8 illustrates a cross-sectional view of a portion of an alternate embodiment of a MLLM having one permanent magnet on a back path.

Referring now to FIG. 8, shown is a portion of a relatively expensive, alternate embodiment of a MLLM which utilizes a single permanent magnet 62 on the back path. The elements depicted on one side of a dividing line 801 shown in FIG. 8 are mirrored on the other side of the dividing line 801 such that the system 10 (FIG. 1) is symmetrical about the line 801, and the elements within the system 10 (FIG. 1) are arranged according to a coordinate system 801. The length of the illustrated permanent magnet 62 runs within the y-z plane in the y-direction, and the width of the permanent magnet 62 runs in the z-direction. The width of the permanent magnet 62 occupies substantially the entire surface area of the back of the stator assembly 20, and the polarity of the permanent magnet 62 is from south to north in the positive z-direction.

Referring now to FIG. 9, shown is a portion of an alternate embodiment of an MLLM having a main stator assembly on top and bottom 66A, and in the middle 66B, and a permanent magnet 62 bias in a center region. It should be noted that this design is different from designs shown in FIGS. 5-8 because in this design the permanent magnet flux passes through the main motor airgaps 320. This particular design may compromise hysteresis motor thrust generation because the thrust force generated by a hysteresis motor is directly proportional to the area of hysteresis. By reducing the biased area, the amount of generated flux is also reduced. The elements within FIG. 9 that are depicted on one side of a dividing line 901, are mirrored on the other side of the dividing line 901 such that the system 10 is symmetrical about the line 901. The elements within the system 10 (FIG. 1) are arranged according to a coordinate system 901.

Further referring to FIG. 9, and in more detail, the main stator assembly includes a first portion 66A that runs along the top and the bottom of the assembly and occupies the x-y plane, and a second portion 66B that has a length that occupies the x-y plane and is independent from the first portion 66A. The permanent magnet 62 is located in the center of the stator assembly 20 such that its length runs along the x-y plane and it is bounded in the x-direction on one side by the first portion of the main stator 66A, and on the other side by the second portion of the main stator 66A. The polarity of the permanent magnet 62 runs from north to south in the negative x-direction.

Referring now to FIG. 10, shown is a portion of an alternate embodiment of a magnetically levitated linear motor having four permanent magnets 62A-62D arranged at a yaw control stator 70. It should be noted that in this design, permanent magnet 62A-62D flux closes locally around the yaw control stator teeth 107. It is not necessary to connect the top and bottom yaw control stators because the fluxes of the permanent magnets 62A-62D do not go through that path. It should be appreciated that the elements depicted on one side of a dividing line 1001 shown in FIG. 10 are mirrored on the other side of the dividing line 1001 such that the system 10 (FIG. 1) is symmetrical about the line 1001, and the elements within the system 10 (FIG. 1) are arranged according to a coordinate system 1010.

Further referring to FIG. 10, illustrated is a stator assembly 20 that includes a main stator 66 that is bounded on the top and the bottom by a first and second yaw control stator 70A, 70B that can contain multiple yaw control stator teeth 107. A first permanent magnet 62A and a second permanent magnet 62B are proximately situated on either side of the first yaw control stator 70A in the z-direction, and a third permanent magnet 62C and a fourth permanent magnet 62D are proximately situated on either side of the second yaw control stator 70B in the z-direction. It should be appreciated that the first yaw control stator 70A is disposed between the first and second permanent magnets 62A, 62B, while the second yaw control stator 70B is disposed between the third and fourth permanent magnets 62C, 62D. Furthermore, all four permanent magnets 62A-D have a length that runs in the x-y plane in the y-direction and a polarity that runs from north to south in the negative x-direction.

Figure 11:
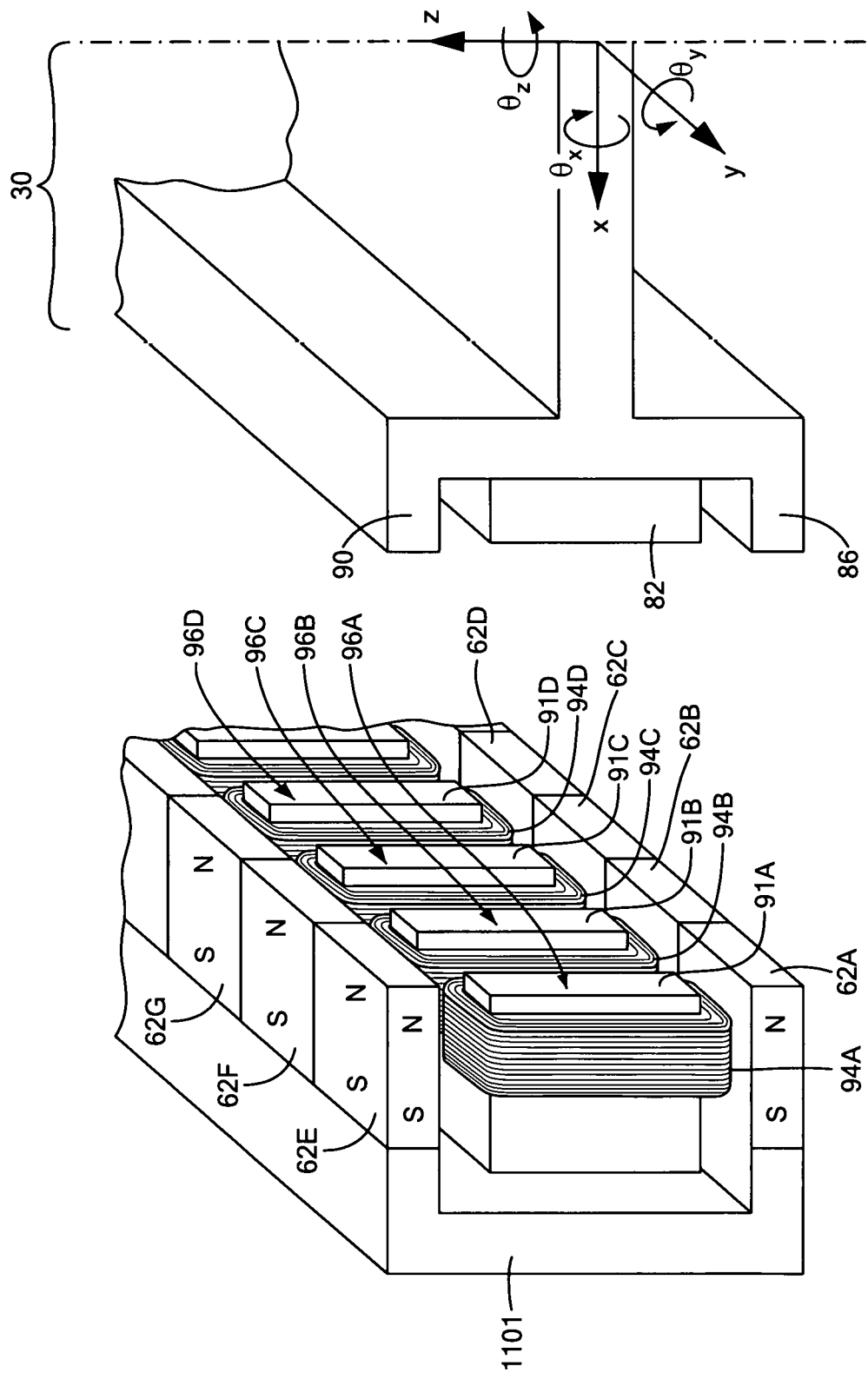
FIG. 11 illustrates an isometric view of a portion of an alternate embodiment of a MLLM having separate control of each coil with control x- and $\theta_z$-directional magnetic suspension achieved using these coils.

Referring now to FIG. 11, shown is a portion of an alternate embodiment of a magnetically levitated linear motor comprising lumped stator elements 96A-D comprised of stator elements 91A-D and associated coils 94A-D (with only some of the stator elements and coils shown in FIG. 11). Lumped stator elements 96A-D may be separately controlled by a set of permanent magnets 62A-G and the coils 94A-D. The x- and $\theta_z$-directional magnetic suspensions may thus be controlled using coils 94A-D. No separate yaw control stator is required. Top and bottom air gaps are used for permanent magnet fluxes generated by the permanent magnets 62A-G.

Each lumped stator coil 96A-D illustrated in FIG. 11 is bounded on the top and the bottom in the positive and negative z-direction by a distinct set of permanent magnets 62A-62G. For example, a lumped stator coil 96A is bounded on the top by one permanent magnet 62E and on the bottom by a second permanent magnet 62A. By placing each lumped stator coil element 96A between two permanent magnets 62E, 62A, each individual lumped stator coil element 96A-D can be individually controlled. In this embodiment, the permanent magnets 62A-G are held in place and connected by a stator 1101.

Described herein is an MLLS driven by linear hysteresis motors separated by a channel within which a stage is magnetically levitated and transported. This design may be used, for example, in a complex lithography system requiring ultra-tight contamination requirements.

It should be appreciated that the illustrative embodiments of FIGS. 1-4B described above utilize a hysteresis motor for thrust force generation. The secondary for hysteresis motor may be provided from a material such as steel having a large hysteresis, e.g. tool steel, FeCrCo alloy, AlNiCo magnets, etc. It should, however, be appreciated that this same design can use an induction linear motor for thrust generation.

Having described preferred embodiments which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

All publications and references cited herein are expressly incorporated herein by reference in their entirety.

What is claimed is:

1. A magnetically levitated stage assembly comprising:
   a first motor stator comprising a first portion of a first hysteresis motor;
   a second motor stator comprising a first portion of a second hysteresis motor, the second motor stator positioned opposite the first motor stator to create a transportation channel between the first and second motor stator;
   a stage, movable within the transportation channel and along a first axis, wherein the first portion of the first hysteresis motor and the first portion of the second hysteresis motor are magnetically coupled to the stage to drive the stage along the first axis; and
   a sensing arrangement positioned below the stage to sense a position of the stage along the first axis.

2. The magnetically levitated stage assembly of claim 1, further comprising:
   a first shock absorption system positioned perpendicular to the first motor stator and the second motor stator, and enclosing a first end of the transportation channel; and
   a second shock absorption system enclosing a second end of the transportation channel, wherein the second shock absorption system is positioned parallel to the first shock absorption system.

3. The magnetically levitated stage assembly of claim 1, wherein the first portion of the first hysteresis motor and the first portion of the second hysteresis motor each comprise a flux-biasing structure.

4. The magnetically levitated stage assembly of claim 3, wherein the flux-biasing structure comprises a permanent magnet, a main stator, a yaw control stator and a stator back iron.

5. The magnetically levitated stage assembly of claim 4, wherein the main stator comprises one or more lumped windings and one or more stator elements.

6. The magnetically levitated stage assembly of claim 5, wherein the one or more lumped windings are serially connected to form a three-phase motor.

7. The magnetically levitated stage assembly of claim 5, wherein the one or more stator elements comprise stator teeth.

8. The magnetically levitated stage assembly of claim 4, wherein the yaw control stator comprises one or more lumped windings.

9. The magnetically levitated stage assembly of claim 8, wherein the one or more lumped windings are serially connected to form a five-phase motor.

10. The magnetically levitated stage assembly of claim 1 wherein the stage further comprises a second portion of the first hysteresis motor and a second portion of the second hysteresis motor.

11. The magnetically levitated stage assembly of claim 10, wherein the second portion of the first hysteresis motor and the second portion of the second hysteresis motor each comprise a hysteresis secondary.

12. The magnetically levitated stage assembly of claim 11, wherein the first hysteresis motor comprises the second portion of the first hysteresis motor magnetically coupled to the first portion of the first hysteresis motor.

13. The magnetically levitated stage assembly of claim 11, wherein the second hysteresis motor comprises the second portion of the second hysteresis motor magnetically coupled to the first portion of the second hysteresis motor.

14. The magnetically levitated stage assembly of claim 1, wherein the sensing arrangement further comprises one or more magnetic encoders.

15. The magnetically levitated stage assembly of claim 14, wherein the one or more magnetic encoders comprise one of a Hall effect sensor and a magnetoresistance sensor.

16. The magnetically levitated stage assembly of claim 14, wherein the one or more magnetic encoders sense a change in the position of the stage along the first axis and generate positional feedback describing the change.

17. The magnetically levitated stage assembly of claim 16, wherein a processor uses the positional feedback to control operation of the first and second hysteresis motors.

18. The magnetically levitated stage assembly of claim 1, wherein the first and second motor stators each further comprise one or more rows of biasing magnets.

19. The magnetically levitated stage assembly of claim 18, wherein operation of the one or more rows of biasing magnets imparts a force to the stage to levitate the stage within the transportation channel.

20. The magnetically levitated stage assembly of claim 1, wherein the first and second hysteresis motors use electromagnetic torque to drive the stage along the first axis.

21. A lithography system comprising:
a processor; and
a magnetically levitated stage assembly comprising:
a first motor stator comprising a portion of a first hysteresis motor,
a second motor stator comprising a portion of a second hysteresis motor, the second motor stator positioned opposite the first motor stator to create a transportation channel between the first and second motor stator,
a stage, movable within the transportation channel and along a first axis, wherein the first portion of the first hysteresis motor and the first portion of the second hysteresis motor are magnetically coupled to the stage to drive the stage along the first axis, wherein the stage transports a reticle from a first position to a second position, and
a sensing arrangement positioned below the stage to sense a position of the stage along the first axis.

22. The lithography system of claim 21, further comprising a closed area having a pressure less than 100 nanopascals.

23. The lithography system of claim 22, wherein the magnetically levitated stage assembly resides within the closed area.

24. The lithography system of claim 21, further comprising an ultra-violet light source for illuminating a photoresist coating on the reticle.

25. The lithography system of claim 24, wherein the ultra-violet light source comprises an extreme ultra-violet light source.

26. The lithography system of claim 21, wherein the processor receives positional feedback from the sensing arrangement that indicates the position of the stage along the first axis.

27. The lithography system of claim 26, wherein the processor operates the first hysteresis motor and the second hysteresis motor in response to the received positional feedback.

* * * * *